(12) United States Patent
Chapman et al.

(10) Patent No.: US 6,346,826 B1
(45) Date of Patent: *Feb. 12, 2002

(54) PROGRAMMABLE GATE ARRAY DEVICE

(75) Inventors: Hugh Norman Chapman; Michael Robert Whaley, both of Colorado Springs, CO (US)

(73) Assignee: Integrated Logic Systems, Inc, Colorado Springs, CO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/219,663

(22) Filed: Dec. 23, 1998

(51) Int. Cl.$^7$ ...................... H03K 19/177; H01L 25/00
(52) U.S. Cl. ............................. 326/41; 326/39; 326/47; 326/101
(58) Field of Search ................................ 326/101–103, 326/39, 41, 47, 93, 96; 257/208–209, 211

(56) References Cited

U.S. PATENT DOCUMENTS

| | | | |
|---|---|---|---|
| 4,387,503 A | 6/1983 | Aswell et al. | |
| 4,684,967 A | 8/1987 | Taylor, Sr. et al. | |
| 4,727,493 A | 2/1988 | Taylor, Sr. | |
| 4,780,846 A | * 10/1988 | Tanabe et al. | 257/211 |
| 4,855,958 A | * 8/1989 | Ikeda | 257/211 |
| 4,870,302 A | * 9/1989 | Freeman | 326/40 |
| 5,136,188 A | * 8/1992 | Ha et al. | 326/39 |
| 5,378,904 A | * 1/1995 | Suzuki et al. | 326/41 |
| 5,491,353 A | 2/1996 | Kean | |
| 5,517,135 A | * 5/1996 | Young | 326/86 |
| 5,619,062 A | 4/1997 | Janai et al. | |
| 5,679,967 A | 10/1997 | Janai et al. | |
| 5,682,107 A | * 10/1997 | Tavana et al. | 326/41 |
| 5,748,942 A | 5/1998 | Duncan | |
| 5,801,406 A | 9/1998 | Lubow et al. | |
| 5,818,728 A | 10/1998 | Yoeli et al. | |
| 5,933,023 A | * 8/1999 | Young | 326/41 |

* cited by examiner

*Primary Examiner*—Michael Tokar
*Assistant Examiner*—Steven S. Paik
(74) *Attorney, Agent, or Firm*—Dale B. Halling

(57) ABSTRACT

A programmable gate array device (10) has a repeating block of circuitry (16) that includes a lowest metal layer. The repeating block of circuitry (16) includes a row of combinatorial blocks (20) and a row of flip flop circuitry (22). A number of metal segments (38) run perpendicular to the row of combinatorial blocks (20). The metal segments (38) are formed in a middle metal layer. A customizable metal layer forms a top metal layer (40).

23 Claims, 4 Drawing Sheets

PROGRAMMABLE GATE ARRAY DEVICE

FIELD OF THE INVENTION

The present invention relates generally to the field of integrated circuits and more particularly to a programmable gate array device.

BACKGROUND OF THE INVENTION

Single metal mask programmable gate arrays typically have combinatorial blocks that use a first metal layer to form the basic electrical connections of the combinatorial blocks. In addition, the first metal commonly has a plurality of metal cross connects. The metal cross connects provide the basic interconnectivity of the gate array device. The programmable metal mask layer is then used to provide the customized connections that define the device for a particular function. Unfortunately, the metal cross connects take up valuable space that cannot be used for circuitry. This wastes silicon wafer space and limits the circuitry that can be placed on the integrated circuit.

Thus there exists a need for a programmable gate array device that overcomes these and other problems.

SUMMARY OF THE INVENTION

A programmable gate array device that overcomes these and other problems has a repeating block of circuitry that includes a lower metal layer. The repeating block of circuitry includes a row of combinatorial blocks. A number of metal segments run perpendicular to the row of combinatorial blocks. The metal segments are formed in a middle metal layer. A customizable metal layer forms a top metal layer.

DETAILED DESCRIPTION OF THE DRAWINGS

Figure 1:
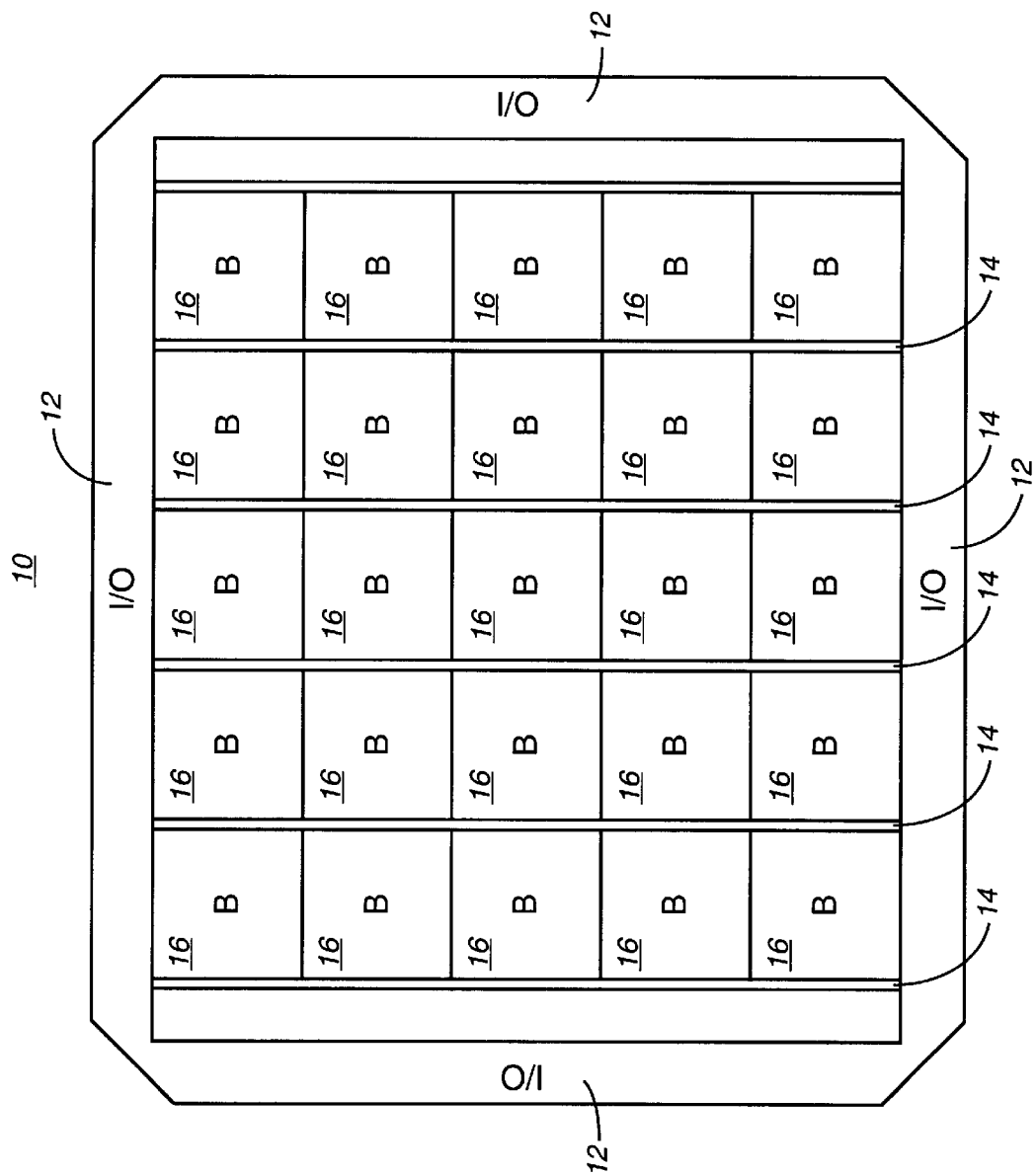
FIG. 1 is a schematic representation of a programmable gate array device in accordance with one embodiment of the invention.

The present invention uses a multi-level metal process, having at least three metal layers, with a programmable top metal mask layer to form a programmable gate array device. FIG. 1 is a schematic representation of a programmable gate array device 10 in accordance with one embodiment of the invention. The device 10 has a perimeter formed of input/output (I/O) circuitry 12. The I/O circuitry 12 provides the basic communication between the device 10 and the external world. Inside of the I/O circuitry 12 is a plurality of rows 14 of power and ground buses. Between the plurality of rows 14 of power and ground buses is a plurality of standard circuitry blocks (repeating blocks of circuitry, B) 16. These standard circuitry blocks are connected together by the programmable top metal mask layer to form circuits that meet a particular application.

Figure 2:
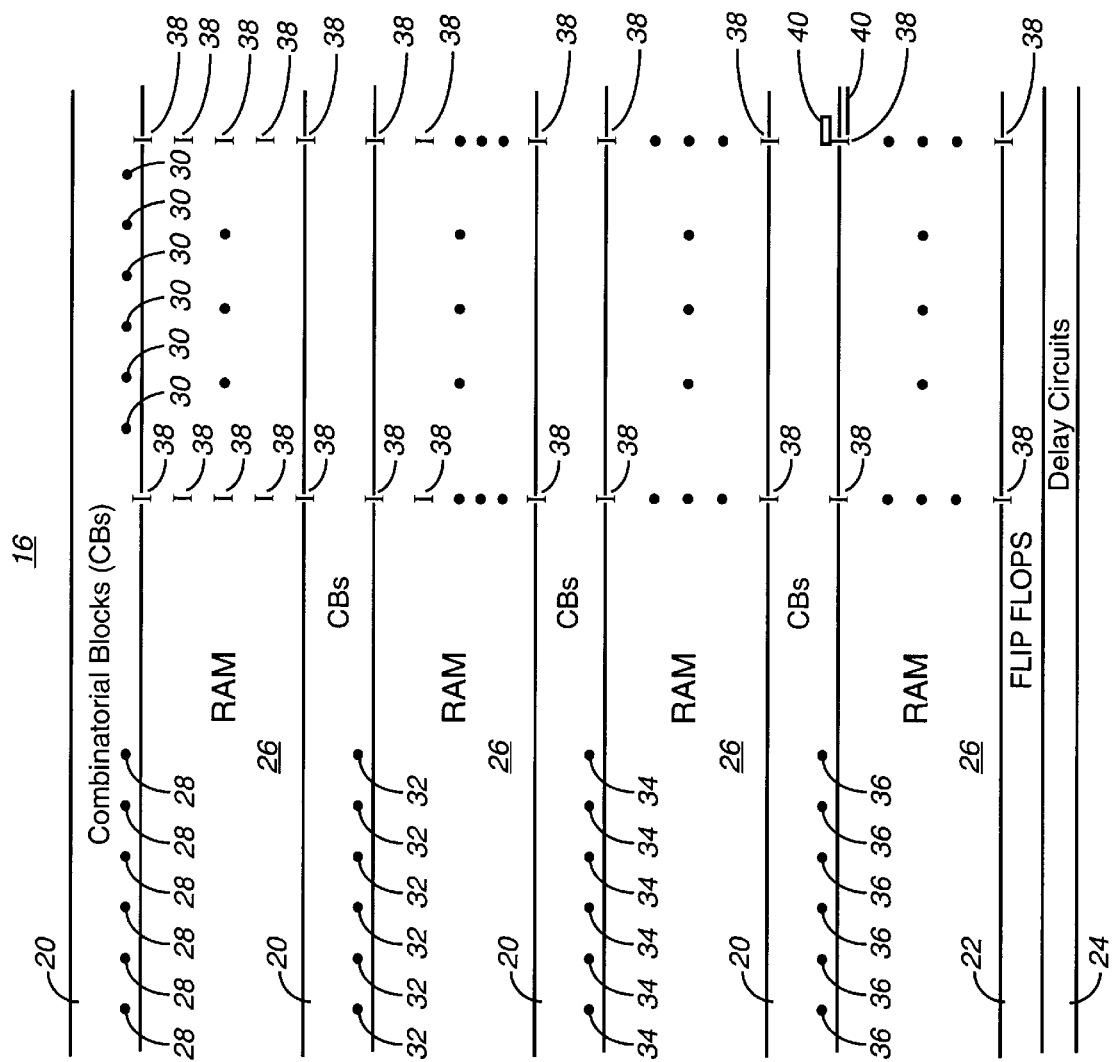
FIG. 2 is a schematic representation of a standard block of circuitry for a programmable gate array device in accordance with one embodiment of the invention.

FIG. 2 is a schematic representation of a standard block of circuitry 16 for a programmable gate array device in accordance with one embodiment of the invention. The standard block of circuitry 16 has a plurality of rows (at least one row) of combinatorial blocks (CBs) 20. The standard block of circuitry 16 includes a row of flip flop circuitry 22, in one embodiment. In another embodiment, a row of delay circuits (plurality of dedicated delay blocks) 24 is adjacent to the row flip flop circuitry 22. Because the block is repeating the delay circuits 24 are adjacent to a row combinatorial blocks. In one embodiment the delay circuits are designed to provide one nanosecond delay increments. The delay circuits 24 are formed from inverters having very precise gate sizes.

Between the rows of combinatorial blocks 20 are a plurality of RAM (random access memory) cells 26. The top row of combinatorial blocks includes a plurality of read/write (input/output; I/O) pins 28 that are connected to RAM cells 0–5. A plurality of delay access pins 30 are positioned on the right side of the combinatorial block row 20. Decoding pins 32 for the RAM cells 26 are found in the second row of combinatorial blocks 20. Read/write pins 34 for RAM cells 6–11 are found in the third row of combinatorial blocks 20. Read/write pins 36 for RAM cells 12–17 are found in the fourth row of combinatorial blocks 20. Note that this particular arrangement is for illustration purposes only and numerous other pin and RAM cell arrangements could be used, as will be apparent to those skilled in the art.

The middle (second in one embodiment) metal layer forms a plurality of metal segments 38, running perpendicular to the rows of combinatorial blocks in this example. Note that only a few of the metal segments 38 are shown for illustration, but that the metal segments cover the area between the combinatorial rows 20. The number of metal segments placed vertically between rows varies, but is typically between five and thirty. Note that in one embodiment the flip flop circuitry 22 and delay circuits 24 require more space than the combinatorial blocks 20. The metal segments 38 would overlap the flip flop circuits 22, the combinatorial blocks 20 and completely cover the delay circuits 24, in one embodiment.

The top (third) metal layer is the customizable mask metal layer that customizes the circuitry for a particular purpose. An example of a portion of the top metal layer 40 is shown in the lower right hand corner. The example shows the top metal connecting the combinatorial block to a metal segment 38 and connecting the metal segment to another portion of the circuitry.

The invention allows circuitry to be placed under the metal segments 38, because the metal segments are formed at layer two (middle) metal. In the embodiment shown RAM and delay circuitry have been placed under the metal segments 38. However, other circuitry can be placed under the metal segments. This other circuitry includes but is not limited to analog circuits, phase lock loops, delay cells, test circuits and almost any CMOS (complementary metal oxide semiconductor) circuitry.

Figure 5:
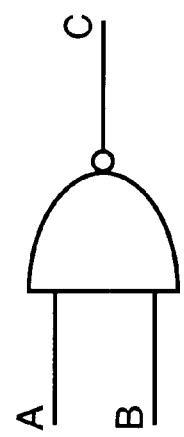
FIG. 5 is a logic diagram of the circuit in FIG. 4.
Figure 4:
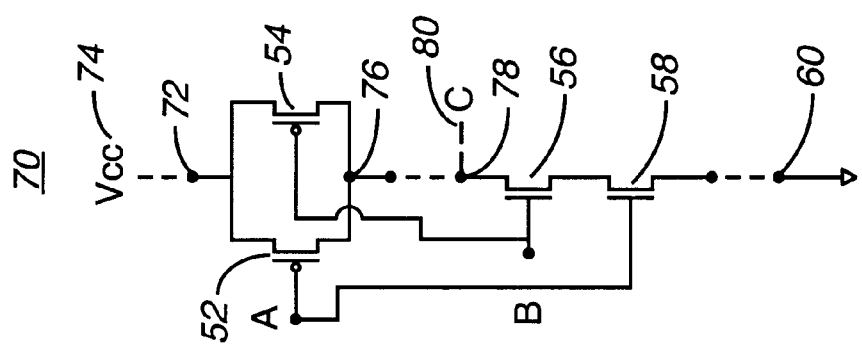
FIG. 4 is a schematic diagram of a combinatorial block electrically configured to form a NAND gate in accordance with one embodiment of the invention.
Figure 3:
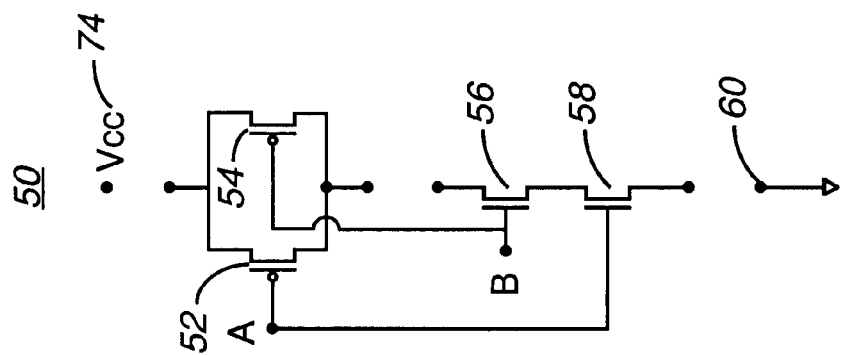
FIG. 3 is a schematic diagram of a combinatorial block in accordance with one embodiment of the invention.

FIG. 3 is a schematic diagram of a combinatorial block (one of a plurality of circuitry blocks) 50 in accordance with one embodiment of the invention. A basic combinatorial block includes a first transistor 52 connected in parallel with a second transistor 54. A third transistor 56 is configured electrically in series with a fourth transistor 58. A ground pin 60 and Vcc (supply voltage) pin 74 are also provided. Note that in this embodiment the first transistor 52 and second transistor 54 are p-channel transistors, while the third transistor 56 and fourth transistor 58 are n-channel transistors. The gate of the second transistor 54 is connected to the gate of the third transistor 56. The gate of the first transistor 52 is connected to the gate of the fourth transistor 58. This basic combinatorial block can be easily configured to form a NAND gate. FIG. 4 is a schematic diagram of a combinatorial block electrically configured to form a NAND gate 70 in accordance with one embodiment of the invention. The dashed lines represent the electrical connections that are made in the top metal layer to form a two input NAND gate. A top pin 72 is tied to a supply voltage 74. The drain 76 of the first transistor 52 and the drain of the second transistor 54 are connected to the drain 78 of the third transistor 56. The "A" input and the "B" input form the two inputs of the NAND gate. The ground pin 60 is connected to the source of the fourth transistor 58. The output of the NAND gate is pin C 80. FIG. 5 is a logic diagram of the circuit in FIG. 4. Note that a four input NAND gate can be easily formed by connecting the first and second transistor 52, 54 of first combinatorial block in parallel with the two other parallel transistors of a second combinatorial block (first four transistors). The series transistors 56, 58 of the first combinatorial block are connected in series with two other series transistors of a second combinatorial block (second four transistors). This forms a four input NAND gate. As will be apparent to those skilled in the art a three input NAND gate or a NAND gate with more than four inputs (four input gate) can be formed similarly. As will be apparent to those skilled in the art other combinatorial block arrangements can be used. For instance the four transistors 52, 54, 56, 58 can be easily configured to form a NOR gate. In another embodiment, the transistors are left completely unconnected. This allows a wide variety of gates to be formed.

Figure 6:
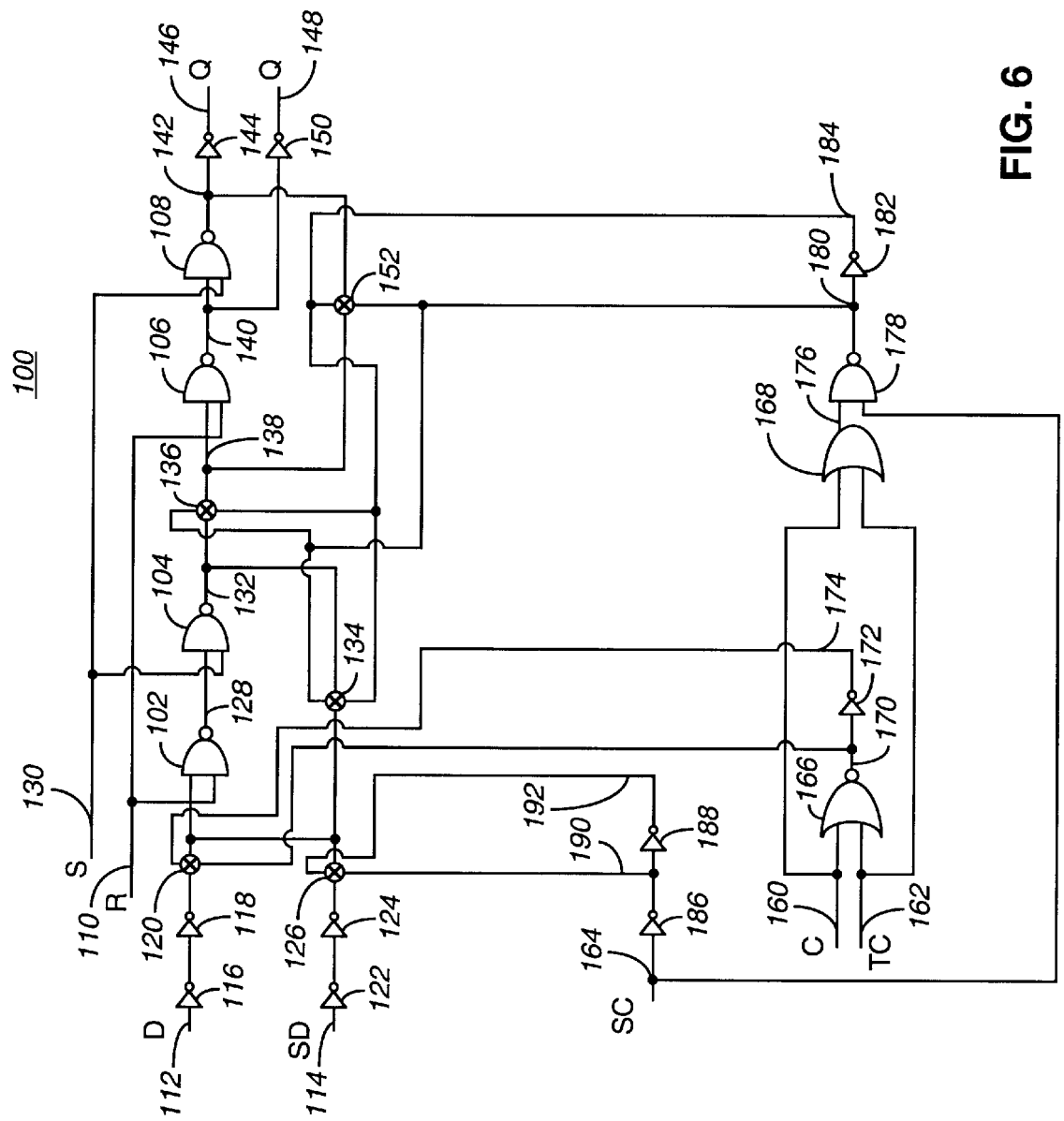
FIG. 6 is a logic diagram of a flip flop unit in accordance with one embodiment of the invention.

FIG. 6 is a logic diagram of a flip flop unit 100 in accordance with one embodiment of the invention. The basic circuitry of the flip flop unit 100 has four NAND gates 102, 104, 106, 108. One input to the first NAND gate 102 is the reset-not (R) 110 input. The other input is the data input (D) 112 electrically connected to the scan data input (SD) 114. Note that the data input 112 is passed through a pair of inverters 116, 118 and then through a first clock gate 120. The scan data input 114 is passed through a pair of inverters 122, 124 and then through a clock gate 126. The inverters 116, 118, 122, 124 are used to introduce set time delays to eliminate race conditions (adjusts set-up and hold times).

The output 128 of the first NAND gate 102 is one of the inputs to the second NAND gate 104. The second input of the second NAND gate 104 is connected to set-not input (S) 130. The output 132 of the second NAND gate 104 is connected to a second clock gate 134 and a third clock gate 136. The second clock gate 134 provides a feed back loop to the other input of the first NAND gate 102. The third clock gate 136 has an output 138 connected to one of the inputs of the third NAND gate 106. The second input of the third NAND gate 106 is connected to the reset-not input 110.

The output 140 of the third NAND gate 106 is one input to the fourth NAND gate 108. The second input of the fourth NAND gate 108 is the set input 130. The output 142 of the fourth NAND gate 108 is passed through an inverter 144 to form the not Q output 146. The Q output 148 is formed by passing the output 140 of the third NAND gate 106 through an inverter 150. The output 142 of the fourth NAND gate 108 is feed back through a fourth clock gate 152 to the first input of the third NAND gate 106. Note that the first clock gate 120 and the fourth clock gate 152 are in phase with each other but out of phase with the second clock gate 134 and the third clock gate 136.

In one embodiment, the flip flop unit 100 has three clock inputs (at least two clock inputs), system clock (C) 160, test clock (TC) 162 and scan clock (SC) 164. The system clock 160 is the standard clock input, however an application may not require the flip flop to be clocked. The test clock input 162 allows the flip flop to always be clocked for testing. The scan clock input 164 is used to input test vectors. In normal operations the scan clock is held at a logic level one. The clock input 160 and test clock input 162 form the inputs to a NOR gate 166 and the inputs to OR gate 168. The output of the NOR gate 170 is connected to an inverter 172. The input 170 and output 174 of the inverter 172 are used to drive the first clock gate 120.

The output 176 of the OR gate 168 forms an input to a NAND gate 178. The second input of the NAND gate 178 is connected to the scan clock input 164. The output 180 of the NAND gate 178 is connected to an inverter 182. The input 180 and output 184 of the inverter 182 are used to drive the second clock gate 134, the third clock gate 136 and the fourth clock gate 152.

The scan clock input 164 passes through a pair of inverters 186, 188. The outputs 190, 192 are used to drive the clock gate 126 that gates the scan data input 114.

The flip flop unit 100 provides the basic circuitry to build any standard type of flip flop. In addition, the test clock input structure allows a user to clock the flip flop for testing purposes. The scan clock allows a user to easily input test vectors for testing purposes. While a specific flip flop circuit has been described, the invention is not limited to this embodiment. As will be apparent to others skilled in the are there are numerous other flip flop circuits that could be used as part of the invention.

Thus there has been described a programmable gate array device that more efficiently takes advantage of the available silicon wafer space. While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A programmable gate array device comprising:
   a repeating block of circuitry including a first metal layer, including a row of combinatorial blocks;
   a plurality of metal segments running perpendicular to the row of combinatorial blocks, the plurality of metal segments in a second metal layer; and
   a programmable metal mask layer forming a third metal layer.

2. The programmable gate array of claim 1, further including a row of flip flop circuitry.

3. The programmable gate array of claim 2, further including a plurality of RAM cells between the row of flip flop circuitry and the row of combinatorial blocks.

4. The programmable gate array of claim 3, wherein the plurality of metal segments lay on top of the plurality of RAM cells.

5. The programmable gate array of claim 1, wherein the row of combinatorial blocks comprise a plurality of circuitry blocks each having a first transistor configured electrically in parallel with a second transistor and a third transistor configured electrically in series with a fourth transistor.

6. The programmable gate array of claim 5, wherein a four input gate is formed by electrically connecting a first combinatorial block with a second combinatorial block to form a circuit having a first four transistors electrically connected in parallel and a second four transistors electrical connected in series.

7. The programmable gate array of claim 2, wherein the row of flip flop circuitry includes a plurality of flip flop units, each of the plurality of flip flop units including at least two clock inputs.

8. The programmable gate array of claim 7, wherein the at least two clock inputs include a system clock, a test clock and a scan clock.

9. The programmable gate array of claim 8, wherein the scan clock is held at a logic level one during standard operation.

10. The programmable gate array of claim 8, wherein the system clock and the test clock are inputs to a NOR gate and the output of the NOR gate is connected to a clock gate.

11. A standard circuitry block for a programmable gate array device, the standard circuitry block comprising:
  a first row of RAM;
  a row of combinatorial blocks side by side the first row of RAM;
  a second row of RAM side by side the row of combinatorial blocks; and
  a row of flip flop circuitry side by side the second row of RAM.

12. The standard circuitry block of claim 11, wherein the row of combinatorial blocks comprises a plurality of circuitry blocks each having a first transistor configured electrically in parallel with a second transistor and a third transistor configured electrically in series with a fourth transistor.

13. The standard circuitry block of claim 12, wherein the row2 of combinatorial blocks includes a plurality of read/write pins to the second row of RAM.

14. The standard circuitry block of claim 13, further including a plurality of dedicated delay blocks adjacent to the row of combinatorial blocks.

15. The standard circuitry block of claim 11, wherein the row of flip flop circuitry includes a plurality of flip flop units, each of the plurality of flip flop units including at least two clock inputs.

16. The standard circuitry block of claim 15, wherein a test clock and a system clock are inputs to a NOR gate and an OR gate, an output of the NOR gate is connected to an input of an inverter, the input and an output of the inverter are used to drive a first clock gate of each of the plurality of flip flop units.

17. The standard circuitry block of claim 16, wherein an output of the OR gate is an input to a NAND gate, a second input of the NAND gate is connected to a scan clock, an output of the NAND gate is an input of an inverter, the input and an output of the inverter are used to drive a second clock gate, a third clock gate and a fourth clock gate.

18. The standard circuitry block of claim 17, wherein the first clock gate is driven in-phase with the fourth clock gate and is driven out-of-phase with the second clock gate and is driven out-of-phase with the third clock gate.

19. A programmable gate array device, comprising:
  a repeating block of circuitry including a lowest metal layer, the repeating block of circuitry including a row of combinatorial blocks;
  a middle metal layer having a plurality metal connectors; and
  a programmable metal mask layer formed of a plurality of customized metal connectors.

20. The programmable gate array device of claim 19, further including a row of RAM.

21. The programmable gate array device of claim 19, further including a row of flip flop circuitry.

22. The programmable gate array device of claim 21, further including a row of analog circuitry between the row of combinatorial blocks and the row of flip flop circuitry.

23. The programmable gate array device of claim 19, wherein the plurality of metal connectors in the middle metal layer include a plurality of metal segments running perpendicular to the row of combinatorial blocks.

* * * * *